United States Patent
Kawakita et al.

(12) 
(10) Patent No.: US 11,909,174 B2
(45) Date of Patent: Feb. 20, 2024

(54) REFLECTION FILTER DEVICE AND WAVELENGTH-TUNABLE LASER DEVICE

(71) Applicant: FURUKAWA ELECTRIC CO., LTD., Tokyo (JP)

(72) Inventors: Yasumasa Kawakita, Tokyo (JP); Yasutaka Higa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 850 days.

(21) Appl. No.: 16/986,343

(22) Filed: Aug. 6, 2020

(65) Prior Publication Data

US 2020/0366058 A1 Nov. 19, 2020

Related U.S. Application Data

(63) Continuation of application No. PCT/JP2019/004444, filed on Feb. 7, 2019.

(30) Foreign Application Priority Data

Feb. 14, 2018 (JP) ................................ 2018-024032

(51) Int. Cl.
*H01S 5/068* (2006.01)
*H01S 3/08* (2023.01)
(Continued)

(52) U.S. Cl.
CPC .......... *H01S 5/068* (2013.01); *H01S 3/08059* (2013.01); *H01S 3/10053* (2013.01);
(Continued)

(58) Field of Classification Search
CPC .. H01S 5/068; H01S 3/08059; H01S 3/10053; H01S 5/1007; H01S 5/101;
(Continued)

(56) References Cited

U.S. PATENT DOCUMENTS 6,728,279 B1 * 4/2004 Sarlet .................. H01S 5/06256
372/43.01
8,467,122 B2 * 6/2013 Zheng ..................... H01S 5/142
359/344
(Continued)

FOREIGN PATENT DOCUMENTS

CN 107431331 A 12/2017
JP 2009-59729 A 3/2009
(Continued)

OTHER PUBLICATIONS

International Search Report dated May 7, 2019 in PCT/JP2019/004444 filed on Feb. 7, 2019, 1 page.
(Continued)

*Primary Examiner* — Vu A Vu

(74) *Attorney, Agent, or Firm* — Oblon, McClelland, Maier & Neustadt, L.L.P.

(57) ABSTRACT

A reflection filter device includes: a ring resonator filter including a ring-shaped waveguide and two arms, each of the two arms being optically coupled to the ring-shaped waveguide; and a dual-branch portion including a light input/output port and two branch ports, the light input/output port being configured to allow input and output of light, the two branch ports being configured to allow output of the light input from the light input/output port, the light being split into two, the two arms being connected to the two branch ports, respectively, at least one of the two arms being equipped with a phase adjuster.

10 Claims, 6 Drawing Sheets

(51) Int. Cl.
  *H01S 3/10* (2006.01)
  *H01S 5/10* (2021.01)
  *H01S 5/14* (2006.01)
  *H01S 5/024* (2006.01)

(52) U.S. Cl.
  CPC ............ *H01S 5/101* (2013.01); *H01S 5/1007* (2013.01); *H01S 5/141* (2013.01); *H01S 5/02453* (2013.01)

(58) Field of Classification Search
  CPC .. H01S 5/141; H01S 5/02453; H01S 5/06246; H01S 5/021; H01S 5/026; H01S 2301/166; H01S 5/06256; H01S 5/142; H01S 5/0261
  USPC .......................................................... 372/20
  See application file for complete search history.

(56) References Cited

U.S. PATENT DOCUMENTS

| | | | | |
|---|---|---|---|---|
| 9,130,350 | B2* | 9/2015 | Jeong | H01S 5/146 |
| 9,176,280 | B2* | 11/2015 | Li | H01S 5/02326 |
| 9,419,412 | B2* | 8/2016 | Krishnamurthy | H01S 5/4087 |
| 9,653,882 | B1* | 5/2017 | Zheng | H01S 5/142 |
| 9,939,663 | B2* | 4/2018 | Luo | G02F 1/011 |
| 10,193,305 | B2* | 1/2019 | Kawakita | H01S 5/0085 |
| 10,281,746 | B2* | 5/2019 | Zheng | H01S 5/125 |
| 2009/0122817 | A1* | 5/2009 | Sato | G02B 6/12007 372/20 |
| 2016/0336718 | A1 | 11/2016 | Takabayashi et al. | |
| 2018/0026426 | A1 | 1/2018 | Kawakita et al. | |

FOREIGN PATENT DOCUMENTS

| | | |
|---|---|---|
| JP | 2014-7435 A | 1/2014 |
| JP | 2016-162828 A | 9/2016 |
| JP | 2016-178283 A | 10/2016 |
| JP | 2016-180867 A | 10/2016 |
| JP | 2016-213379 A | 12/2016 |
| JP | 2017-142348 A | 8/2017 |
| WO | WO-2016152274 A1 * | 9/2016 ............ G02B 5/284 |

OTHER PUBLICATIONS

Combined Chinese Office Action and Seach Report dated Sep. 26, 2022 in Chinese Patent Application No. 201980012781.7 (with English Translation of Office Action only), 12 pages.

Chinese Office Action dated May 26, 2023 in Chinese Application No. 201980012781.7 (with unedited computer-generated English translation) 11 pages.

* cited by examiner

REFLECTION FILTER DEVICE AND WAVELENGTH-TUNABLE LASER DEVICE

CROSS-REFERENCE TO RELATED APPLICATION(S)

This application is a continuation of International Application No. PCT/JP2019/004444, filed on Feb. 7, 2019 which claims the benefit of priority of the prior Japanese Patent Application No. 2018-024032, filed on Feb. 14, 2018, the entire contents of which are incorporated herein by reference.

BACKGROUND

The present disclosure relates to a reflection filter device and a wavelength-tunable laser device including the same.

In the related art, a technique for adjusting the phase of light in a laser resonator and adjusting the wavelength of longitudinal modes in a wavelength-tunable laser device has been disclosed (Japanese Laid-open Patent Publication No. 2016-178283).

SUMMARY

There is a need for providing a reflection filter device, in which finely adjustment of the phase can be done easily, and wavelength-tunable laser device having the same.

According to an embodiment, a reflection filter device includes: a ring resonator filter including a ring-shaped waveguide and two arms, each of the two arms being optically coupled to the ring-shaped waveguide; and a dual-branch portion including a light input/output port and two branch ports, the light input/output port being configured to allow input and output of light, the two branch ports being configured to allow output of the light input from the light input/output port, the light being split into two, the two arms being connected to the two branch ports, respectively. Further, at least one of the two arms is equipped with a phase adjuster.

According to an embodiment, a wavelength-tunable laser device includes: a laser resonator including a diffraction grating, a ring-shaped waveguide, two arms, a dual-branch portion, and a reflection filter device, each of the two arms being optically coupled to the ring-shaped waveguide, the dual-branch portion including a light input/output port and two branch ports, the light input/output port being configured to allow input and output of light, the two branch ports being configured to allow output of the light input from the light input/output port, the light being split into two, the two arms being connected to the dual-branch ports, respectively, at least one of the two arms being equipped with a phase adjuster and a refractive index changing unit arranged along the phase adjuster, the reflection filter device being optically coupled to the diffraction grating on the light input/output port; and a gain portion disposed in the laser resonator. Further, the phase adjuster and the refractive index changing unit are arranged in the arms and separated from the gain portion, the diffraction grating generates a first comb-shaped reflection spectrum, the reflection filter device generates a second comb-shaped reflection spectrum having a peak with a full width at half maximum narrower than a full width at half maximum of a peak of the first comb-shaped reflection spectrum and having a wavelength interval different from a wavelength interval of the first comb-shaped reflection spectrum, and the diffraction grating and the reflection filter device are configured such that one of peaks of the first comb-shaped reflection spectrum and one of peaks of the second comb-shaped reflection spectrum are overlappable on a wavelength axis.

DETAILED DESCRIPTION

Figure 1:
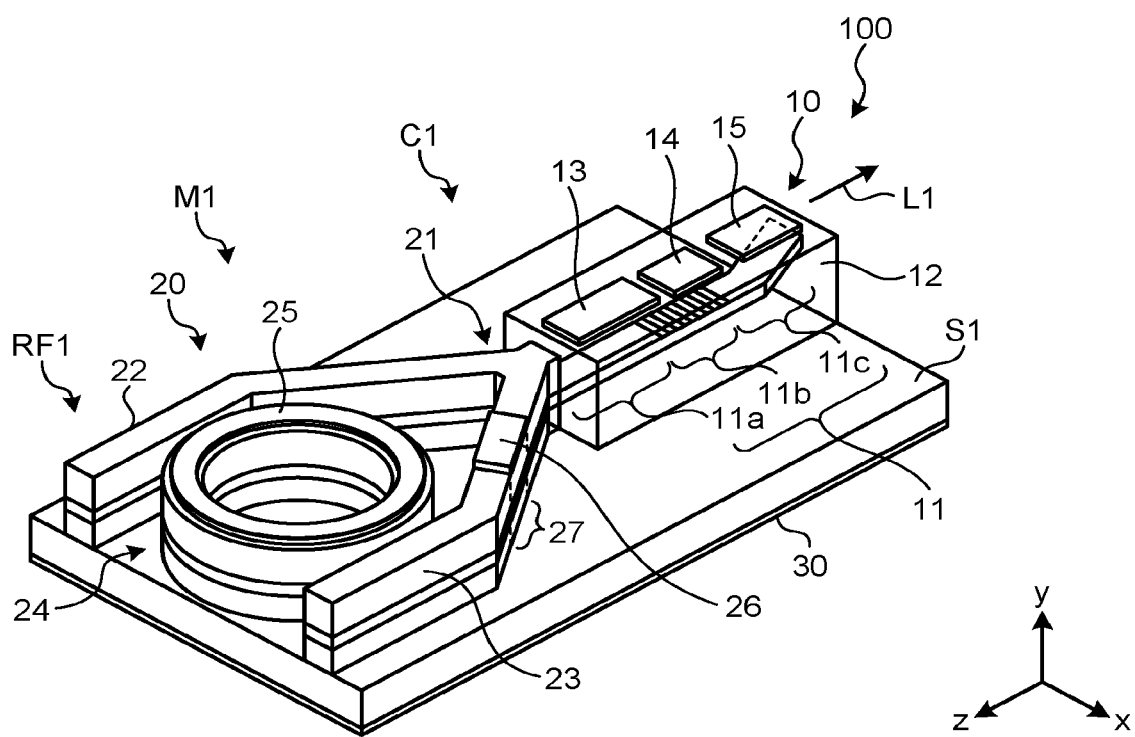
FIG. 1 is a schematic perspective view of a wavelength-tunable laser device including a reflection filter device according to a first embodiment.

In a wavelength-tunable laser device in the related art, in order to yield laser light having a narrow linewidth to a degree required for use in recent coherent communication, if the length of a laser resonator is increased, the longitudinal mode spacing is reduced. In order to obtain single mode oscillation, it is preferable that the phase be finely adjusted easily.

Embodiments will be described in detail below with reference to the drawings. The present invention is not intended to be limited by the embodiments. In the drawings, the same or corresponding elements are denoted by the same reference signs when necessary. The drawings are schematic illustrations, and it should be noted that the dimensional relationship between elements, the scale of each element, and the like may be different from the actual ones. Similarly, the dimensional relationships or scales may differ among the drawings. In the drawings, xyz coordinate axes are illustrated when necessary and used to describe a direction.

First Embodiment

FIG. 1 is a schematic perspective view of a wavelength-tunable laser device including a reflection filter device according to a first embodiment. A wavelength-tunable laser device 100 is configured to achieve laser oscillation in the 1.55 μm band and output laser light. The wavelength-tunable laser device 100 includes a first waveguide 10 and a second waveguide 20, which are formed on a common substrate S1. The substrate S1 is formed of, for example, n-type InP. An n-side electrode 30 is formed on the back surface of the substrate S1. The n-side electrode 30 is formed of, for example, AuGeNi and is in ohmic contact with the substrate S1.

The first waveguide 10 includes a waveguide 11, a semiconductor stack 12, p-side electrodes 13 and 15, and a microheater 14 that is a resistive heater containing Ti. The waveguide 11 is formed so as to extend in the z direction in the semiconductor stack 12. In the first waveguide 10, a gain portion 11a, an optical amplifying portion 11c, and a distributed Bragg reflector (DBR) diffraction grating layer 11b are disposed. The semiconductor stack 12 is formed such that semiconductor layers are layered and includes functions such as a cladding portion for the waveguide 11. The configurations of the waveguide 11 and the semiconductor stack 12 will be described in detail later.

The p-side electrode 13 is disposed along the gain portion 11a on the semiconductor stack 12. The p-side electrode 15 is disposed along the optical amplifying portion 11c on the semiconductor stack 12. A SiN protective film described later is formed on the semiconductor stack 12, and the p-side electrodes 13 and 15 are in contact with the semiconductor stack 12 through openings formed in the SiN protective film. The microheater 14 as a first refractive index changing unit is disposed along the diffraction grating layer 11b on the SiN protective film on the semiconductor stack 12.

Figure 2A:
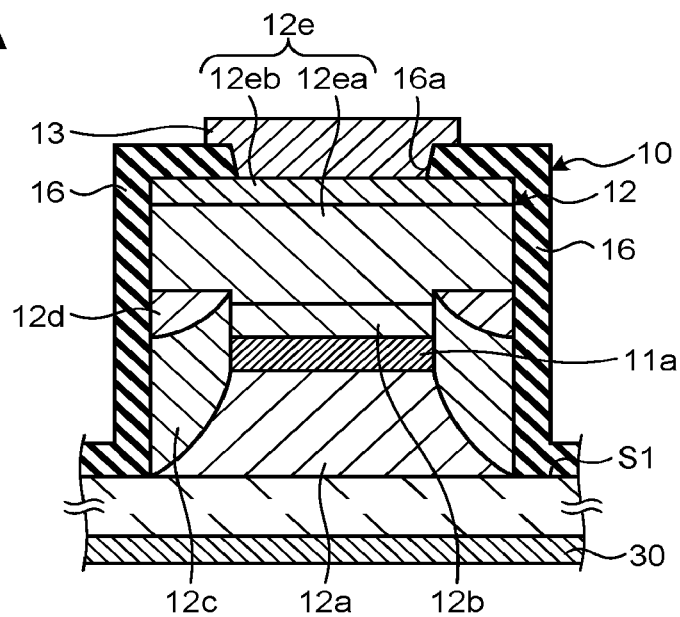
FIG. 2A is a schematic cross-sectional view of the wavelength-tunable laser device illustrated in FIG. 1.

FIG. 2A is a cross-sectional view of a section including the gain portion 11a in the first waveguide 10, cut along a plane parallel to the xy plane in FIG. 1.

The gain portion 11a is an active core layer. The gain portion 11a has a multiple quantum well structure including a plurality of well layers and a plurality of barrier layers alternately layered, and upper and lower optical confinement layers sandwiching the multiple quantum well structure from above and below. The gain portion 11a emits light by injection of current. The well layers and the barrier layers in the multiple quantum well structure of the gain portion 11a are formed of InGaAsP of different compositions. The emission wavelength band of the gain portion 11a is the 1.55 μm band in the present embodiment. The lower optical confinement layer is formed of n-type InGaAsP. The upper optical confinement layer is formed of p-type InGaAsP. The bandgap wavelength of the lower and upper optical confinement layers is set to a wavelength shorter than the bandgap wavelength of the well layers.

The semiconductor stack 12 in a section including the gain portion 11a has the following configuration, for example. The semiconductor stack 12 has an n-type semiconductor layer 12a formed of a buffer layer of n-type InP having the function of a lower cladding layer on the n-type InP substrate forming the substrate S1. The gain portion 11a is layered on the n-type semiconductor layer 12a. A spacer layer 12b of p-type InP is further layered on the gain portion 11a. The gain portion 11a and the spacer layer 12b are formed, for example, by etching in a stripe mesa structure having a width (for example, 1.8 μm) suitable for propagating light in the 1.55 μm band in the single mode. On each side (right-left direction in the drawing sheet) of the stripe mesa structure, a buried structure having a current blocking structure including a p-type InP buried layer 12c and an n-type InP current blocking layer 12d is formed. On the gain portion 11a and the buried structures, a p-type semiconductor layer 12e is layered, which includes a spacer layer 12ea made of p-type InP and a contact layer 12eb made of p-type InGaAs. The contact layer 12eb is layered on the spacer layer 12ea and forms the top layer of the semiconductor stack 12. The p-type semiconductor layer 12e is provided to extend at least from immediately above the gain portion 11a to a part of the buried structures on both sides. In the semiconductor stack 12, a SiN protective film 16 is formed so as to cover the semiconductor stack 12. The p-side electrode 13 contains AuZn and is formed on the contact layer 12eb to come into ohmic contact with the contact layer 12eb through an opening 16a in the SiN protective film 16. The configuration described above enables current injection from the n-side electrode 30 and the p-side electrode 13 to the gain portion 11a.

The optical amplifying portion 11c is also an active core layer having a configuration similar to the gain portion 11a. The semiconductor stack 12 in a section including the optical amplifying portion 11c has a configuration similar to the semiconductor stack 12 in the section including the gain portion 11a. This configuration enables current injection from the n-side electrode 30 and the p-side electrode 15 to the optical amplifying portion 11c. The optical amplifying portion 11c functions as a semiconductor optical amplifier integrated in the wavelength-tunable laser device 100.

Figure 2B:
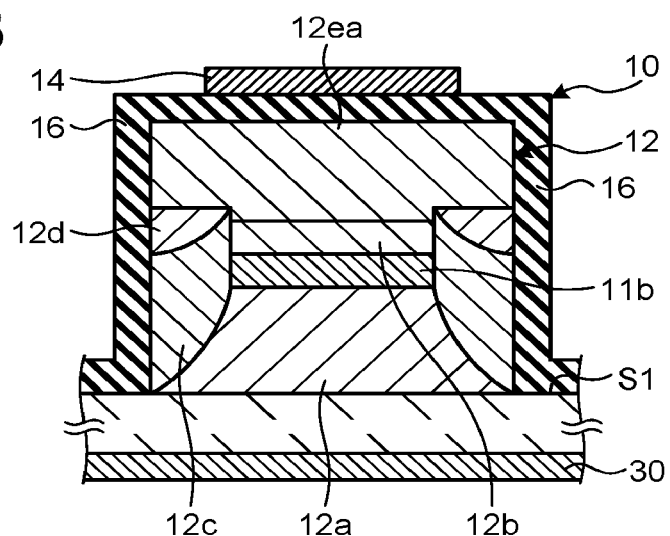
FIG. 2B is a schematic cross-sectional view of the wavelength-tunable laser device illustrated in FIG. 1.

FIG. 2B is a cross-sectional view of a section including the diffraction grating layer 11b in the first waveguide 10, cut along a plane parallel to the xy plane in FIG. 1. As illustrated in FIG. 2B, the first waveguide 10 including the diffraction grating layer 11b has a cross-sectional structure in which the gain portion 11a is replaced by the diffraction grating layer 11b that is an optical guide layer, the p-side electrode 13 is replaced by the microheater 14, the contact layer 12eb is removed, and the opening 16a is not formed in the SiN protective film 16, in the structure illustrated in FIG. 2A.

The diffraction grating layer 11b is provided in the vicinity of the gain portion 11a and, in the present embodiment, provided adjacent to the gain portion 11a in the light propagating direction (z direction) of the waveguide 11. The diffraction grating layer 11b has a sampled diffraction grating formed in a p-type InGaAsP layer along the z direction, and the grooves in the diffraction grating are filled with InP. In the diffraction grating layer 11b, the diffraction grating has a fixed pitch but is sampled to create a reflection response substantially periodic as a function of wavelength. The bandgap wavelength of the p-type InGaAsP layer in the diffraction grating layer 11b is preferably shorter than the bandgap wavelength of the gain portion 11a and the optical amplifying portion 11c, for example, 1.2 μm.

As described above, the first waveguide 10 has a buried waveguide structure.

Referring back to FIG. 1, the second waveguide 20 will be described. The second waveguide 20 includes a dual-branch portion 21, two arms 22 and 23, a ring-shaped waveguide 24, and a microheater 25 that is a resistive heater containing Ti.

The dual-branch portion 21 has a light input/output port through which light is input/output, and two branch ports through which light input from the light input/output port and split into two is output. In the present embodiment, the dual-branch portion 21 is configured with a 1×2 branched waveguide including a 1×2 multi-mode interference (MMI) waveguide. Two branch ports are connected to two arms 22 and 23, and the light input/output port is connected to the first waveguide 10 side. The respective ends of two arms 22 and 23 are integrated by the dual-branch portion 21 and optically coupled to the diffraction grating layer 11b.

The arms 22 and 23 are formed so as to extend from the dual-branch portion 21 in the shape of the letter Y and parallel to each other. The arms 22 and 23 are disposed so as to sandwich the ring-shaped waveguide 24. The arms 22 and 23 are in proximity to the ring-shaped waveguide 24 and both are optically coupled to the ring-shaped waveguide 24 at the same coupling coefficient K. The value of κ is, for example, 0.2. The arms 22 and 23 and the ring-shaped waveguide 24 constitute a ring resonator filter RF1. The ring resonator filter RF1 and the dual-branch portion 21 constitute a reflecting mirror M1 serving as a reflection filter device. The microheater 25 serving as a second refractive index changing unit has a ring shape and is disposed on a SiN protective film formed to cover the ring-shaped waveguide 24.

The arm 23 has a microheater 26 containing Ti and a phase adjuster 27.

Figure 2C:
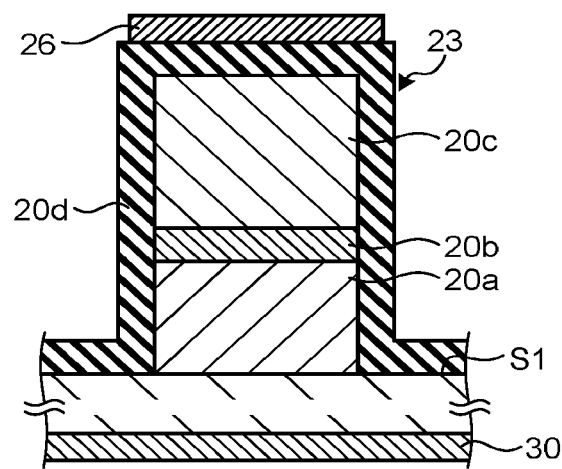
FIG. 2C is a schematic cross-sectional view of the wavelength-tunable laser device illustrated in FIG. 1.

FIG. 2C is a cross-sectional view of the arm 23 including the phase adjuster 27, cut along a plane vertical to the extending direction of the arm 23. As illustrated in FIG. 2C, the arm 23 has a high mesa waveguide structure in which a lower cladding layer 20a made of n-type InP, an optical waveguide layer 20b made of InGaAsP, and an upper cladding layer 20c made of p-type InP are layered in this order on the substrate S1. A SiN protective film 20d is formed to cover the arm 23. The microheater 26 serving as a third refractive index changing unit is disposed along the phase adjuster 27 on the SiN protective film 20d. The other components of the second waveguide 20, namely, the dual-branch portion 21, the arm 22, and the ring-shaped waveguide 24 have a similar high mesa waveguide structure and are covered with a SiN protective film.

The diffraction grating layer 11b and the reflecting mirror M1 optically connected to each other constitute a laser resonator C1. The gain portion 11a is disposed in the laser resonator C1. The phase adjuster 27 is provided in the inside of the reflecting mirror M1 to adjust the characteristics of the reflecting mirror M1.

Figure 3A:
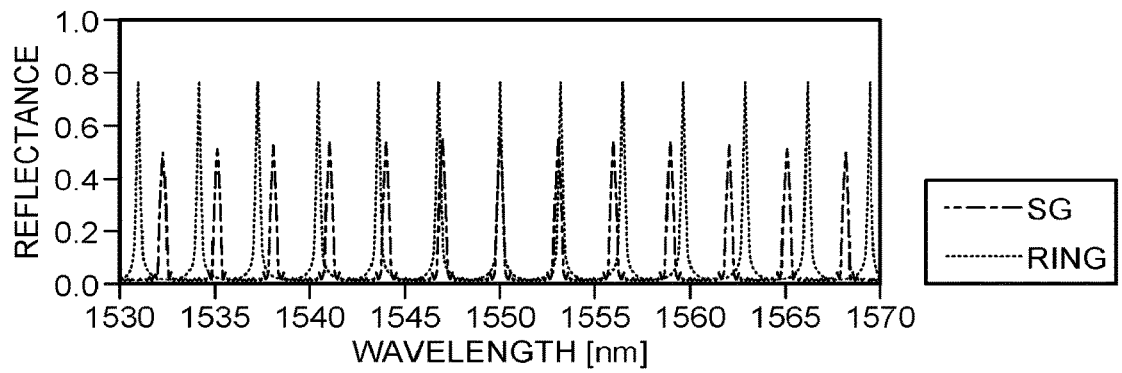
FIG. 3A is a diagram illustrating a first comb-shaped reflection spectrum and a second comb-shaped reflection spectrum.
Figure 3B:
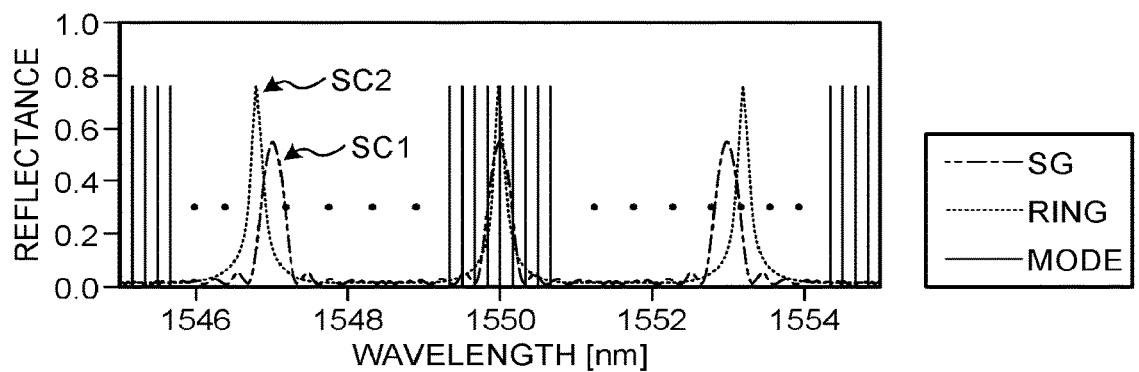
FIG. 3B is a diagram illustrating a first comb-shaped reflection spectrum, a second comb-shaped reflection spectrum, and resonator modes.

The reflection characteristics of the diffraction grating layer 11b and the reflecting mirror M1 will now be described with reference to FIGS. 3A and 3B. In FIGS. 3A and 3B, the vertical axis represents a reflectance. The diffraction grating layer 11b generates a first comb-shaped reflection spectrum having a substantially periodic reflection characteristic at a substantially predetermined wavelength interval, as illustrated by a curve denoted by "SG" in FIG. 3A. The reflecting mirror M1 generates a second comb-shaped reflection spectrum having a periodic reflection characteristic at a predetermined wavelength interval, as illustrated by a curve denoted by "Ring" in FIG. 3A. FIG. 3B is an enlarged illustration of the reflection spectrum in FIG. 3A in the vicinity of 1550 nm. In FIG. 3B, "Mode" represents resonator modes of the laser resonator C1. The resonator modes exist at least in the wavelength range from 1530 nm to 1570 nm illustrated in FIG. 3A, although illustrated only partially in the drawing. As illustrated in FIGS. 3A and 3B, the second comb-shaped reflection spectrum has a peak SC2 with a full width at half maximum narrower than the full width at half maximum of a spectral component SC1 in the first comb-shaped reflection spectrum and has a substantially periodic reflection characteristic at a wavelength interval different from the wavelength interval in the first comb-shaped reflection spectrum. However, it should be noted that the wavelength interval between spectral components is not exactly constant because of the chromatic dispersion of refractive indices.

The characteristics of the comb-shaped reflection spectra are illustrated. The wavelength interval (free spectrum region: FSR) between peaks of the first comb-shaped reflection spectrum is 373 GHz in terms of optical frequency, and the full width at half maximum of each peak is 43 GHz in terms of optical frequency. The wavelength interval (free spectrum region: FSR) between peaks of the second comb-shaped reflection spectrum is 400 GHz in terms of optical frequency, and the full width at half maximum of each peak is 25 GHz in terms of optical frequency.

The peaks of the second comb-shaped reflection spectrum have a shape steeply changing with wavelength and have a wavelength region in which the second derivative of the reflectance as a function of the wavelength has a positive value in the shorter wavelength side and the longer wavelength side of the peak. The peaks of the second comb-shaped reflection spectrum have, for example, a double exponential distribution (Laplace distribution) shape. Compared with the peaks of the second comb-shaped reflection spectrum, the peaks of the first comb-shaped reflection spectrum have a shape gently changing with wavelength and have a wavelength region in which the second derivative of the reflectance as a function of the wavelength has a negative value in the shorter wavelength side and the longer wavelength side of the peak. The peaks of the first comb-shaped reflection spectrum have, for example, a Gaussian shape.

Figure 4:
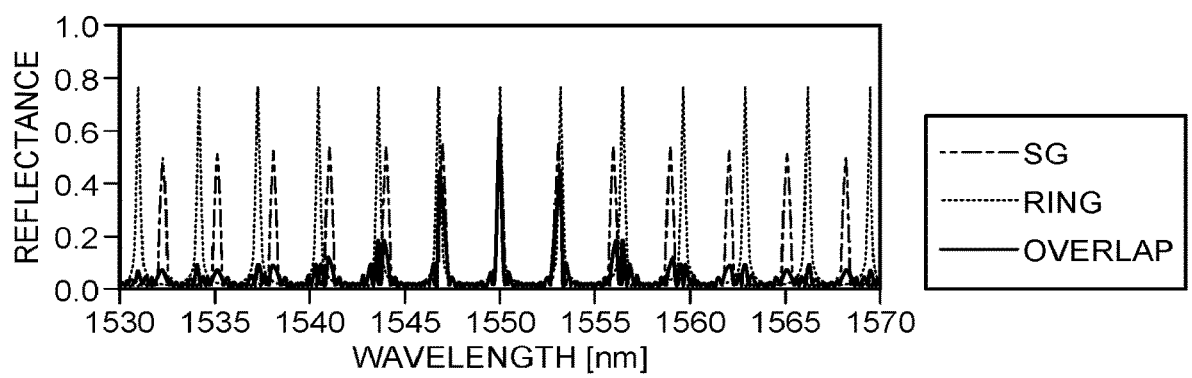
FIG. 4 is a diagram illustrating a first comb-shaped reflection spectrum, a second comb-shaped reflection spectrum, and the overlap therebetween.
Figure 5:
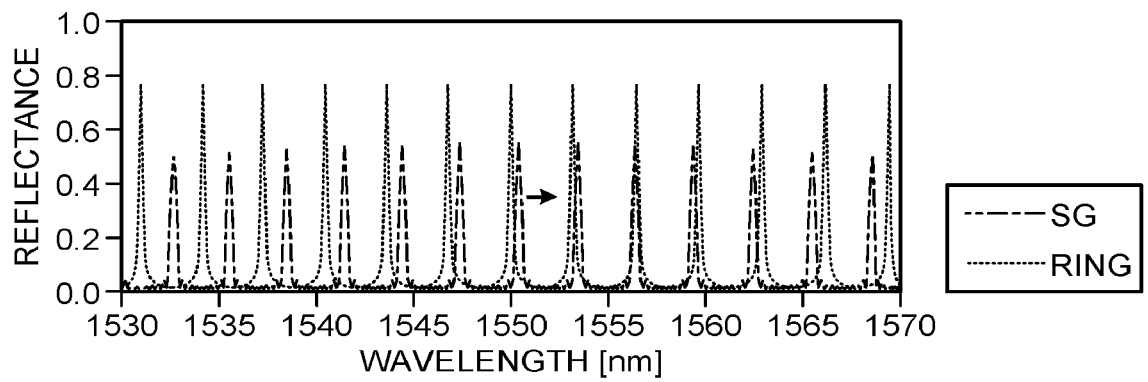
FIG. 5 is a diagram illustrating a method of selecting a laser emission wavelength in the wavelength-tunable laser device illustrated in FIG. 1.

In the wavelength-tunable laser device 100, in order to achieve laser oscillation, one of the peaks of the first comb-shaped reflection spectrum can be overlapped with one of the peaks of the second comb-shaped reflection spectrum on the wavelength axis. FIG. 4 is a diagram illustrating a first comb-shaped reflection spectrum, a second comb-shaped reflection spectrum, and the overlap therebetween. The curve denoted by "Overlap" illustrates the overlap of the spectra. In the example illustrated in FIG. 4, the overlap is the largest at a wavelength of 1550 nm.

Such an overlap can be achieved by using at least one of the microheater 14 and the microheater 25 and performing at least one of: feeding current to the microheater 14 to heat the diffraction grating layer 11b and change the refractive index thereof by the thermooptic effect, thereby shifting the first comb-shaped reflection spectrum as a whole on the wavelength axis; and feeding current to the microheater 25 to heat the ring-shaped waveguide 24 and change the refractive index thereof, thereby shifting the second comb-shaped reflection spectrum as a whole on the wavelength axis.

On the other hand, in the wavelength-tunable laser device 100, the laser resonator C1 has resonator modes, as partially illustrated in FIG. 3B. In the wavelength-tunable laser device 100, the resonator length of the laser resonator C1 is set such that the spacing between resonator modes (longitudinal mode spacing) is equal to or less than 25 GHz. In such a setting, the resonator length of the laser resonator C1 is equal to or longer than 1800 μm, and the linewidth of emitted laser light can be reduced.

In the wavelength-tunable laser device 100, when current is injected from the n-side electrode 30 and the p-side electrode 13 to the gain portion 11a to emit light, laser oscillation occurs at a wavelength at which a peak of a spectral component in the first comb-shaped reflection spectrum, a peak of a spectral component in the second comb-shaped reflection spectrum, and one of resonator modes of the laser resonator are aligned, for example, at 1550 nm, and laser light is output from the diffraction grating layer 11b. This laser light is amplified by the optical amplifying portion 11c functioning as a semiconductor optical amplifier upon injection of current from the n-side electrode 30 and the p-side electrode 15 and is output as laser light L1 (see FIG. 1). The wavelength of the resonator modes of the laser resonator C1 can be finely adjusted by feeding current to the microheater 26 to heat the phase adjuster 27 and change the refractive index thereof, and changing the characteristic of the reflecting mirror M1, consequently shifting the wavelength of the resonator modes as a whole on the wavelength axis. In other words, the phase adjuster 27 is a portion for changing the characteristic of the reflecting mirror M1 by adjusting the phase of light in the reflecting mirror M1 and consequently controlling the optical path length of the laser resonator C1 in the laser resonator C1.

Increasing the resonator length to reduce the linewidth of laser light reduces the spacing between resonator modes. In particular, if the spacing between resonator modes is reduced to such an extent that a plurality of resonator modes exist in the full width at half maximum of a peak of the first comb-shaped reflection spectrum, it is usually difficult to select a resonator mode that causes laser oscillation.

However, in the wavelength-tunable laser device 100, the control of selecting a resonator modes is easy because even when the spacing between resonator modes is narrow, a peak of the second comb-shaped reflection spectrum with a narrower full width at half maximum can exist in a peak of a broader full width at half maximum of the first comb-shaped reflection spectrum. In the wavelength-tunable laser device 100, therefore, the control of selecting a resonator modes is easy even when the laser resonator C1 is configured with such a resonator length that the spacing between resonator modes is such that two or more resonator modes are included in a peak of the first comb-shaped reflection spectrum.

If the peaks of the second comb-shaped reflection spectrum have a double exponential distribution shape, the sharpness of peaks relative to the peaks of the first comb-shaped reflection spectrum can be increased when the peaks of the first comb-shaped reflection spectrum have a Gaussian shape. Accordingly, the peaks of the second comb-shaped reflection spectrum are projecting and higher than the height of peaks of the first comb-shaped reflection spectrum, and the reflectance of peaks of the second comb-shaped reflection spectrum can be easily made higher than the reflectance of peaks of the first comb-shaped reflection spectrum. Stable single mode oscillation therefore can be easily achieved.

Referring now to FIGS. 3A, 3B, 4, and 5, a method of selecting a laser emission wavelength in the wavelength-tunable laser device 100 will be described. In the wavelength-tunable laser device 100, a laser emission wavelength is selected using the Vernier effect.

As illustrated in FIGS. 3A, 3B, and 4, the FSRs of the first comb-shaped reflection spectrum and the second comb-shaped reflection spectrum are designed to be slightly different from each other. When the FSR of the second comb-shaped reflection spectrum with steeper peaks is larger, the height of the peaks in the overlap (for example, the overlap in the vicinity of 1547 nm), adjacent to the highest peak in the spectrum overlap at 1550 nm, is relatively small. As a result, laser oscillation is suppressed at the wavelengths of the peaks in the overlap adjacent to the wavelength with the highest peak in the spectrum overlap, thereby increasing the side mode suppression ratio.

The variable wavelength range in the wavelength-tunable laser device 100 is determined by the least common multiple of FSRs because of the Vernier effect. One of the peaks of the first comb-shaped reflection spectrum is overlapped with one of the peaks of the second comb-shaped reflection spectrum, and at the wavelength at which the peaks are aligned, the reflectance is largest to cause laser oscillation. That is, a laser emission wavelength is roughly determined by the Vernier effect of the diffraction grating layer 11b and the reflecting mirror M1 (supermode). More precisely, the laser emission wavelength is determined by the overlap between the supermode and the wavelength of the resonator modes defined by a path (resonator length) from the diffraction grating layer 11b through the dual-branch portion 21, one of the arms 22 and 23 of the ring resonator filter RF1, the ring-shaped waveguide 24, and the other of the arms 22 and 23, and the dual-branch portion 21 in this order in the laser resonator C1 and back to the diffraction grating layer 1ib. In other words, one of the resonator modes of the laser resonator C1 is aligned with the overlap region between a peak in the first comb-shaped reflection spectrum and a peak in the second comb-shaped reflection spectrum overlapped with each other, and laser oscillation occurs at the wavelength of the aligned resonator modes. In the wavelength-tunable laser device 100, therefore, wavelength tuning is implemented by performing coarse adjustment by tuning the first comb-shaped reflection spectrum and the second comb-shaped reflection spectrum with the microheater 14 for the diffraction grating layer 11b and the microheater 25 for the ring resonator filter RF1, respectively, and performing fine adjustment by tuning the resonator length with the microheater 26 for the phase adjuster 27.

In the state illustrated in FIGS. 3A and 3B (referred to as a first state), the overlap between the first comb-shaped reflection spectrum and the second comb-shaped reflection spectrum is largest at a wavelength of 1550 nm (supermode). In the first state, the laser emission wavelength is coarsely adjusted to the vicinity of 1550 nm. Laser oscillation at a wavelength of 1550 nm can be achieved by finely adjusting the resonator modes by tuning the phase adjuster 27 in the first state.

To change the laser emission wavelength, only the diffraction grating layer 11b is heated by the microheater 14 with the tuning of the ring resonator filter RF1 being fixed. Then, the refractive index of the diffraction grating layer 11b increases because of the thermooptic effect, and the reflection spectrum (first comb-shaped reflection spectrum) of the diffraction grating layer 11b as a whole shifts toward the longer wavelength side as illustrated by the arrow in FIG. 5. As a result, the overlap with a peak of the reflection spectrum (second comb-shaped reflection spectrum) of the reflecting mirror M1 in the vicinity of 1550 nm is lost and then overlapped with another peak (in the vicinity of 1556 nm) present on the longer wavelength side. A transition to another supermode is thus implemented. In addition, laser oscillation in the vicinity of 1556 nm can be implemented by finely adjusting the resonator modes by tuning the phase adjuster 27. To change a laser emission wavelength to the shorter wavelength side, the tuning of the diffraction grating layer 11b is fixed, and only the reflecting mirror M1 is heated with the microheater 25 so that the comb-shaped reflection spectrum of the reflecting mirror M1 as a whole shifts to the longer wavelength side.

The wavelength-tunable laser device 100 uses the thermooptic effect of the microheaters to tune the wavelength. However, to tune the wavelength, the carrier plasma effect of current injection may be used. In this case, since current injection reduces the refractive index, the comb-shaped reflection spectrum as a whole shifts toward the shorter wavelength side to produce an overlap in another spectral component present on the shorter wavelength side relative to the wavelength at which a supermode is previously formed. A new supermode can be thus formed.

In the wavelength-tunable laser device 100, after a transition between supermodes is made, the resonator modes is finely adjusted by tuning the phase adjuster 27. When the spacing between resonator modes is narrow and is narrower than the full width at half maximum of a peak of the comb-shaped reflection spectrum of the diffraction grating layer 11b, a plurality of resonator modes may exist in the peak of the diffraction grating layer 11b. In the wavelength-tunable laser device 100, however, the full width at half maximum of a peak of the comb-shaped reflection spectrum of the reflecting mirror M1 is narrower than the full width at half maximum of a peak of the comb-shaped reflection spectrum of the diffraction grating layer 11b. It is therefore less likely that a plurality of resonator modes compete in a peak of the comb-shaped reflection spectrum of the reflecting mirror M1, and it is easy to finely adjust the resonator modes by tuning the phase adjuster 27 such that only one resonator modes is aligned with a peak of the reflecting mirror M1.

In the wavelength-tunable laser device 100, optical feedback in the laser resonator C1 is performed on a path from the diffraction grating layer 11b through the dual-branch portion 21, one of the arms 22 and 23, the ring-shaped waveguide 24, the other of the arms 22 and 23, and the dual-branch portion 21 and back to the diffraction grating layer 11b, and each optical feedback trip includes a circumnavigation of the ring-shaped waveguide 24. There are two optical paths for optical feedback: a clockwise optical path and a counterclockwise optical path. This increases the length of optical feedback and therefore can increase an effective resonator length, thereby reducing the linewidth of laser light L1.

Since the phase adjuster 27 is provided in the arm 23, light passes through the phase adjuster 27 only in one direction in each optical feedback. Therefore, the optical path length of light subjected to phase adjustment in each optical feedback is equivalent to the optical path length in the phase adjuster 27. On the other hand, for example, when a phase adjuster is disposed in the first waveguide as in the wavelength-tunable laser device in the first embodiment described in Japanese Laid-open Patent Publication No. 2016-178283 (hereinafter referred to as a wavelength-tunable laser device having a conventional structure), light reciprocates in the phase adjuster in each optical feedback. In this configuration, the optical path length of light subjected to phase adjustment in each optical feedback is equivalent to twice the optical path length in the phase adjuster, so that the phase changes more. When the phase adjuster is positioned such that light reciprocates in the phase adjuster in each optical feedback, the phase changes more, similarly.

Figure 6:
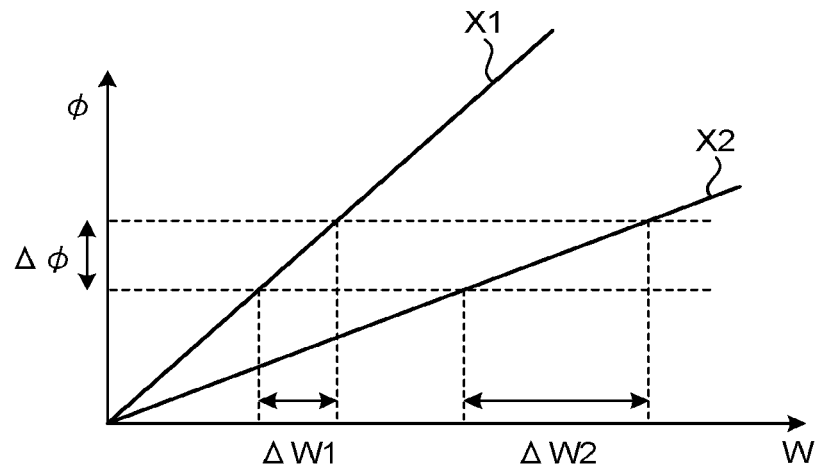
FIG. 6 is a diagram illustrating an example of the relationship between electric power and the phase amount.

The relationship between electric power W applied to the microheater for the phase adjuster for phase adjustment and the phase amount $\varphi$ of light adjusted by the electric power has a characteristic, for example, illustrated in FIG. 6. Line X1 represents the characteristic of the wavelength-tunable laser device having a conventional structure, and line X2 represents the characteristic of the wavelength-tunable laser device 100.

As can be understood from FIG. 6, when the phase of light is to be adjusted by a minute phase amount f$\varphi$p, the wavelength-tunable laser device having a conventional structure requires adjustment of electric power by a minute amount as illustrated by $\Delta$W1. In comparison, the wavelength-tunable laser device 100 can adjust the phase by the phase amount $\Delta \varphi$ by the adjustment of electric power in an amount of $\Delta$W2 greater than $\Delta$W1. In other words, the wavelength-tunable laser device 100 can adjust the phase amount more finely relative to the adjustment resolution of electric power applied to the microheater for the phase adjuster.

In this way, in the wavelength-tunable laser device 100, the phase adjuster 27 is provided in the arm 23 in the reflecting mirror M1 as a reflection filter device. This configuration facilitates fine adjustment when the phase of light is adjusted, that is, when the resonator length of the laser resonator C1 is adjusted.

In the wavelength-tunable laser device 100, the spacing between longitudinal modes is relatively narrow since the resonator length is increased in order to reduce the linewidth. The configuration of the wavelength-tunable laser device 100 that facilitates fine adjustment is effective for precisely adjusting the laser emission wavelength or making it easy to control the microheater (third refractive index changing unit) for the adjustment.

In the wavelength-tunable laser device 100, the arm 23 provided with the phase adjuster 27 has a high mesa waveguide structure. This configuration is preferable in controlling the laser emission wavelength, because heat from the microheater 26 reaches the optical waveguide layer 20b efficiently and fast.

As described above, since the wavelength-tunable laser device 100 includes the reflecting mirror M1 that facilitates fine adjustment of the phase, the laser emission wavelength can be adjusted more precisely, and control for the adjustment can be made easier.

In the wavelength-tunable laser device in Japanese Laid-open Patent Publication No. 2016-178283, the phase adjuster and the gain portion are adjacent to each other, and heat generated through the operation of the gain portion is transmitted to the phase adjuster. As a result, even when the quantity of heat necessary for desired phase adjustment is applied to the microheater of the phase adjuster, heat transmitted from the gain portion interferes and makes it difficult to achieve a desired phase adjustment. In comparison, in the wavelength-tunable laser device 100, the phase adjuster 27 and the microheater 26 are disposed in the arm 23 at a distance from the gain portion 11a. Therefore, compared with the configuration of the wavelength-tunable laser device in Japanese Laid-open Patent Publication No. 2016-178283, the interference of heat generated by the gain portion 11a is prevented, and a desired phase adjustment can be achieved more easily.

The wavelength-tunable laser device 100 can be produced, for example, by a method similar to the wavelength-tunable laser device having a conventional structure described in Japanese Laid-open Patent Publication No. 2016-178283. Since the connecting portion between the first waveguide 10 and the second waveguide 20 is a connecting portion between waveguide structures different from each other, for example, it is preferable that the optical waveguide structure disclosed in Japanese Laid-open Patent Publication No. 2017-142348 is employed to achieve a high tolerance for manufacturing errors with a small loss. In this configuration, the light input/output port side of the dual-branch portion 21 is optically coupled to the waveguide structure (buried waveguide structure) having the diffraction grating layer 11b in a state in which optical propagation modes are made substantially equivalent. As used herein the state in which the optical propagation modes are made substantially equivalent means a design that converts the spot size of propagating light and brings the optical propagation modes close to each other for the purpose of reducing connection loss between two waveguide structures. This state includes not only a case in which propagation modes are the same but also a case in which there is a difference to a degree that connection loss is reduced to a desired value or smaller. U.S. patent application Ser. No. 15/708,994 corresponding to Japanese Laid-open Patent Publication No. 2016-178283 is hereby incorporated by reference in its entirety.

The optical waveguide structure of the connecting portion (hereinafter referred to as a connecting optical waveguide structure, if necessary) between the first waveguide 10 and the second waveguide 20 includes a first section, a second section, a third section, and a fourth section, similar to the optical waveguide structure disclosed in Japanese Laid-open Patent Publication No. 2017-142348. These waveguides are arranged in the order of the first section, the third section, the fourth section, and the second section in the lengthwise direction (light propagation direction).

The first section is a section of the first waveguide 10 including the gain portion 11a, having the buried waveguide structure.

The second section is a section including two branch ports of the dual-branch portion 21 and two arms 22 and 23, that is, two high mesa waveguide structures.

The third section is a section of the first waveguide 10 including the gain portion 11a, having the mesa stripe structure including the buried waveguide structure. That is, the third section is a section in which the buried waveguide structure has a mesa stripe shape.

Confinement of light in the width direction in the buried waveguide structure in the third section is mainly defined by the portion of the buried structure, and the third section is designed such that the effect of the medium present on both sides in the width direction of the mesa stripe structure on light confinement is so small that it can be ignored.

The fourth section is a section between the light input/output port and two branch ports of the dual-branch portion 21, having a high mesa waveguide structure, that is, the portion of the MMI waveguide.

On both sides in the width direction of the high mesa waveguide structures in the second section and the high mesa waveguide structure in the fourth section, a material with a refractive index lower than the optical waveguide layer, for example, $SiO_2$, air, polyimide, is present.

The fourth section optically connects the two high mesa waveguide structures in the second section with the buried waveguide structure in the third section. Specifically, the waveguide width of the high mesa waveguide structure in the fourth section at a connecting end to the buried waveguide structure of the third section is wider than the waveguide width (the width of the gain portion 11a) of the buried waveguide structure in the third section. The waveguide width of the buried waveguide structure in the first section is the same as the waveguide width of the buried waveguide structure in the third section. The waveguide width of the high mesa waveguide structure in the fourth section at the connecting end to the two high mesa waveguide structures in the second section is wider than the sum of the waveguide widths of the two high mesa waveguide structures. The optical waveguide layer in the fourth section connects to two optical waveguide layers in the second section at one end of the high mesa waveguide structure in the fourth section, and the optical waveguide layer connects to the gain portion 11a in the third section at the other end of the high mesa waveguide structure in the fourth section, whereby the high mesa waveguide structure in the fourth section and the buried waveguide structure in the third section are optically connected to each other.

In this connecting optical waveguide structure, the width of the mesa stripe structure in the third section is equal to the waveguide width of the high mesa waveguide structure in the fourth section. In the structure, the fourth section connects to the third section to change from the high mesa waveguide structure to the buried waveguide structure.

This connecting optical waveguide structure operates such that light input from the first section is propagated in the multi-mode through the fourth section and a light spot is imaged at the connecting portion to each of two high mesa waveguide structures in the second section and split into two and output. This connecting optical waveguide structure operates such that light input from two high mesa waveguide structures in the second section is propagated in the multi-mode through the fourth section and multiplexed so that a light spot is imaged at the connecting portion to the buried waveguide structure in the third section and output from the first section.

Having the structure above, the connecting optical waveguide structure can reduce excessive loss that may be produced when the center axis in the direction (width direction) vertical to the lengthwise direction of the optical waveguide layer in the high mesa waveguide structure in the fourth section is displaced from the center axis in the width direction of the gain portion 11a in the buried waveguide structure in the third section and from the center axis in the width direction of the gain portion 11a in the buried waveguide structure in the first section, due to manufacturing errors or the like. That is, this connecting optical waveguide structure has high tolerance for manufacturing errors with a small loss at the connecting portion between different waveguide structures.

Second Embodiment

A second embodiment will now be described. The present second embodiment differs from the first embodiment in that the second waveguide is formed of a silicon (Si) photonics waveguide.

Figure 7:
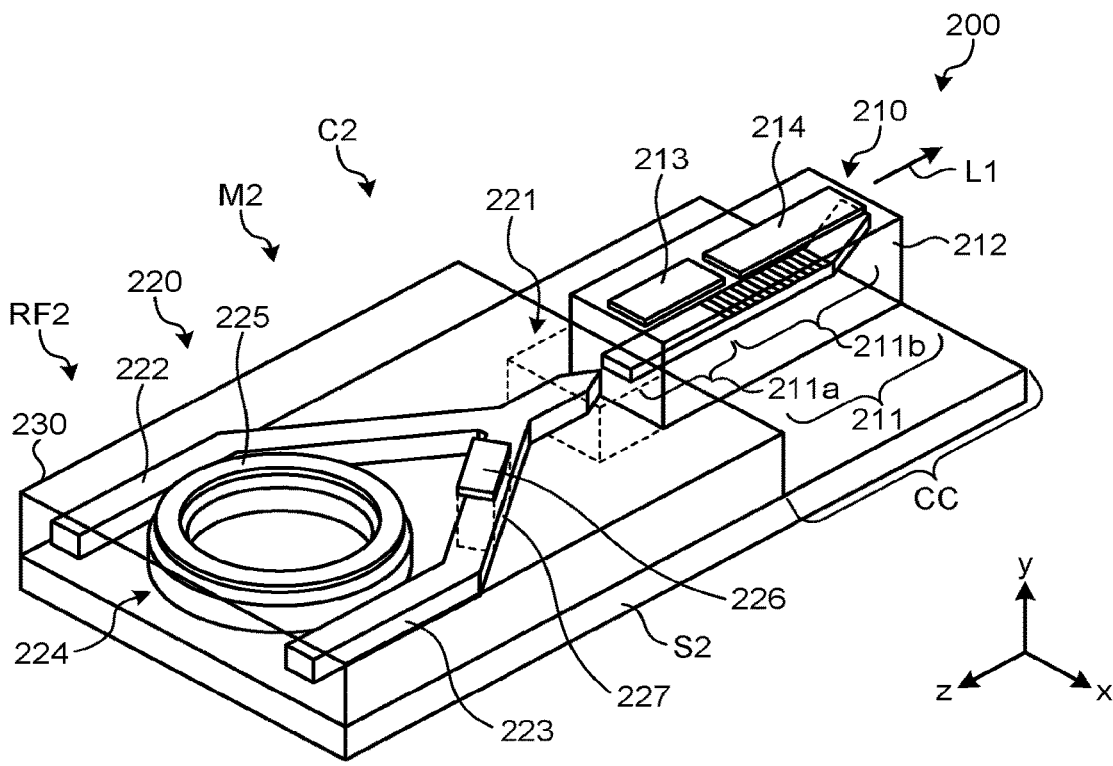
FIG. 7 is a schematic perspective view of a wavelength-tunable laser device according to a second embodiment.

FIG. 7 is a schematic perspective view of a wavelength-tunable laser device according to the second embodiment. A wavelength-tunable laser device 200 is configured such that laser oscillation occurs in the 1.55 μm band and laser light is output. The wavelength-tunable laser device 200 includes a first waveguide 210 and a second waveguide 220.

The first waveguide 210 includes a waveguide 211, a semiconductor stack 212, an n-side electrode 213, and a microheater 214. The waveguide 211 is formed so as to extend in the z direction in the semiconductor stack 212. In the first waveguide 210, a gain portion 211a and a diffraction grating layer 211b in DBR are disposed. The semiconductor stack 212 is formed such that semiconductor layers are layered and includes functions such as a cladding portion for the waveguide 211. The gain portion 211a has a multiple quantum well structure and an optical confinement layer made of the same material as the gain portion 11a in the first embodiment. The diffraction grating layer 211b is formed of a sampled diffraction grating made of the same material as the diffraction grating layer 11b in the first embodiment. The semiconductor stack 212 in a portion including the gain portion 211a is formed with a material and structure similar to the portion including the gain portion 11a of the semiconductor stack 12 in the first embodiment, but the semiconductor stack 212 differs in that it has a stack structure in which the p-type semiconductor layer and the n-type semiconductor layer are reversed in position with the gain portion 211a interposed in the y direction. The semiconductor stack 212 in a portion including the diffraction grating layer 211b is formed with a material and structure similar to the portion including the diffraction grating layer 11b of the semiconductor stack 12 in the first embodiment, but the semiconductor stack 212 differs in that it has a stack structure in which the p-type semiconductor layer and the n-type semiconductor layer are reversed in position with the diffraction grating layer 211*b* interposed in the y direction. The first waveguide 210 has a buried waveguide structure.

The n-side electrode 213 is disposed along the gain portion 211*a* on the semiconductor stack 212. A SiN protective film is formed on the semiconductor stack 212, and the n-side electrode 213 is in contact with the semiconductor stack 212 through an opening formed in the SiN protective film. The microheater 214 as a first refractive index changing unit is disposed along the diffraction grating layer 211*b* on the SiN protective film on the semiconductor stack 212. A not-illustrated p-side electrode is formed on a surface on the opposite side to the surface of the semiconductor stack 212 on which the n-side electrode 213 is formed.

The second waveguide 220 will now be described. The second waveguide 220 is formed of a silicon-on-insulator (SOI) substrate S2. The second waveguide 220 includes a dual-branch portion 221, arms 222 and 223, a ring-shaped waveguide 224, a microheater 225, and an overcladding layer 230 made of $SiO_2$. The arm 223 has a microheater 226 and a phase adjuster 227.

The dual-branch portion 221 has a light input/output port through which light is input/output, and two branch ports through which light input from the light input/output port and split into two is output. In the present embodiment, the dual-branch portion 221 is configured with a 1×2 branched waveguide including a 1×2 MMI waveguide. Two branch ports are connected to two arms 222 and 223, and the light input/output port is connected to the first waveguide 210 side. The respective ends of two arms 222 and 223 are integrated by the dual-branch portion 221 and optically coupled to the diffraction grating layer 211*b*. A tapered portion having its width reducing toward the first waveguide 210 is formed on the light input/output port side of the dual-branch portion 221. On the outer periphery of the tapered portion, an overcladding layer, for example, made of SiN with a refractive index higher than $SiO_2$ is formed to provide a spot size converter structure.

The arms 222 and 223 are formed so as to extend from the dual-branch portion 221 in the shape of the letter Y and parallel to each other. The arms 222 and 223 are disposed so as to sandwich the ring-shaped waveguide 224. The arms 222 and 223 are in proximity to the ring-shaped waveguide 224 and both are optically coupled to the ring-shaped waveguide 224 at the same coupling coefficient K. The arms 222 and 223 and the ring-shaped waveguide 224 constitute a ring resonator filter RF2. The ring resonator filter RF2 and the dual-branch portion 221 constitute a reflecting mirror M2 serving as a reflection filter device. The microheater 225 serving as a second refractive index changing unit has a ring shape and is disposed on the overcladding layer 230 immediately above the ring-shaped waveguide 224. The microheater 226 serving as a third refractive index changing unit is disposed along the phase adjuster 227 on the overcladding layer 230.

The arm 222 has a high mesa waveguide structure including a lower layer including a support layer made of a Si support substrate of the SOI substrate S2 and a buried oxide (BOX) layer of $SiO_2$ positioned on the support layer, and a device layer of Si positioned on the BOX layer. The device layer functions as an optical waveguide layer, and the high mesa waveguide structure is covered with the overcladding layer 230. The other components of the second waveguide 220, namely, the dual-branch portion 221, the arm 223, and the ring-shaped waveguide 224 have a similar high mesa waveguide structure.

The first waveguide 210 is separately fabricated as a gain chip by a known method and is mounted on a concave portion CC formed by removing the device layer, the BOX layer, and a part of the support substrate in the SOI substrate S2 forming the second waveguide 220. The gain portion 211*a* of the first waveguide 210 is butt-joined to the light input/output port of the dual-branch portion 221 of the second waveguide 220.

The diffraction grating layer 211*b* and the reflecting mirror M2 optically connected to each other constitute a laser resonator C2. The gain portion 211*a* is disposed in the laser resonator C2, and the phase adjuster 227 is disposed in the reflecting mirror M2.

In this wavelength-tunable laser device 200, the diffraction grating layer 211*b* generates a first comb-shaped reflection spectrum having a substantially periodic reflection characteristic at a substantially predetermined wavelength interval, similar to the first embodiment. The reflecting mirror M2 generates a second comb-shaped reflection spectrum having a peak with a full width at half maximum narrower than the full width at half maximum of the spectral component in the first comb-shaped reflection spectrum and having a substantially periodic reflection characteristic at a wavelength interval different from the wavelength interval of the first comb-shaped reflection spectrum. Laser oscillation occurs at a wavelength at which a peak of the first comb-shaped reflection spectrum, a peak of the second comb-shaped reflection spectrum, and one of the resonator modes of the laser resonator C2 are aligned. The spacing between resonator modes of the laser resonator C2 is narrower than the full width at half maximum of the spectral component in the first comb-shaped reflection spectrum. Optical feedback in the laser resonator C2 is performed on a path from the diffraction grating layer 211*b* through the dual-branch portion 221, one of the arms 222 and 223 of the ring resonator filter RF2, the ring-shaped waveguide 224, the other of the arms 222 and 223, and the dual-branch portion 221 in this order and back to the diffraction grating layer 211*b*, and each optical feedback trip includes a circumnavigation of the ring-shaped waveguide 224. With this configuration, the wavelength-tunable laser device 200 increases the optical feedback length, thereby reducing the effective linewidth of laser light. Stable single mode oscillation can be implemented similar to the first embodiment.

In the wavelength-tunable laser device 200, the laser emission wavelength can be tuned by performing coarse adjustment by tuning the first comb-shaped reflection spectrum and the second comb-shaped reflection spectrum with the microheater 214 for the diffraction grating layer 211*b* and the microheater 225 for the ring-shaped waveguide 224, respectively, and by performing fine adjustment by tuning the resonator length with the microheater 226 for the phase adjuster 227, similar to the first embodiment.

The wavelength-tunable laser device 200 can reduce the linewidth of laser light and achieve stable single mode oscillation, similar to the first embodiment. In the wavelength-tunable laser device 200, the second waveguide 220 is formed with a Si photonics waveguide. A Si photonics waveguide has resistance to bending because of strong waveguide confinement. A ring-shaped waveguide 224 with a small diameter therefore can be easily implemented. This means that a ring-shaped waveguide 224 with a large FSR can be implemented and the degree of freedom in designing the ring resonator filter RF2 is improved. In this configuration, the wavelength-tunable laser device 200 has a small footprint and a compact size and can output laser light with a high side mode suppression ratio.

Furthermore, in the wavelength-tunable laser device 200, the phase adjuster 227 is provided in the arm 223 in the reflecting mirror M2 as a reflection filter device. This configuration facilitates finer adjustment when the phase of light is adjusted, that is, when the resonator length of the laser resonator C2 is adjusted. The configuration is effective for precisely adjusting the laser emission wavelength or making it easy to control the microheater 226 for the adjustment.

As described above, since the wavelength-tunable laser device 200 includes the reflecting mirror M2 that facilitates fine adjustment of the phase, the laser emission wavelength can be adjusted more precisely, and control for the adjustment can be made easier.

The wavelength-tunable laser device 200 can be produced, for example, by a method similar to the wavelength-tunable laser device in the third embodiment in Japanese Laid-open Patent Publication No. 2016-178283.

Third Embodiment

A third embodiment will now be described. In the present third embodiment, the second waveguide is formed with a silicon photonics waveguide, similar to the second embodiment, but the third embodiment differs in that a diffraction grating is provided in the second waveguide and the first waveguide includes a waveguide in the shape of the letter U.

Figure 8:
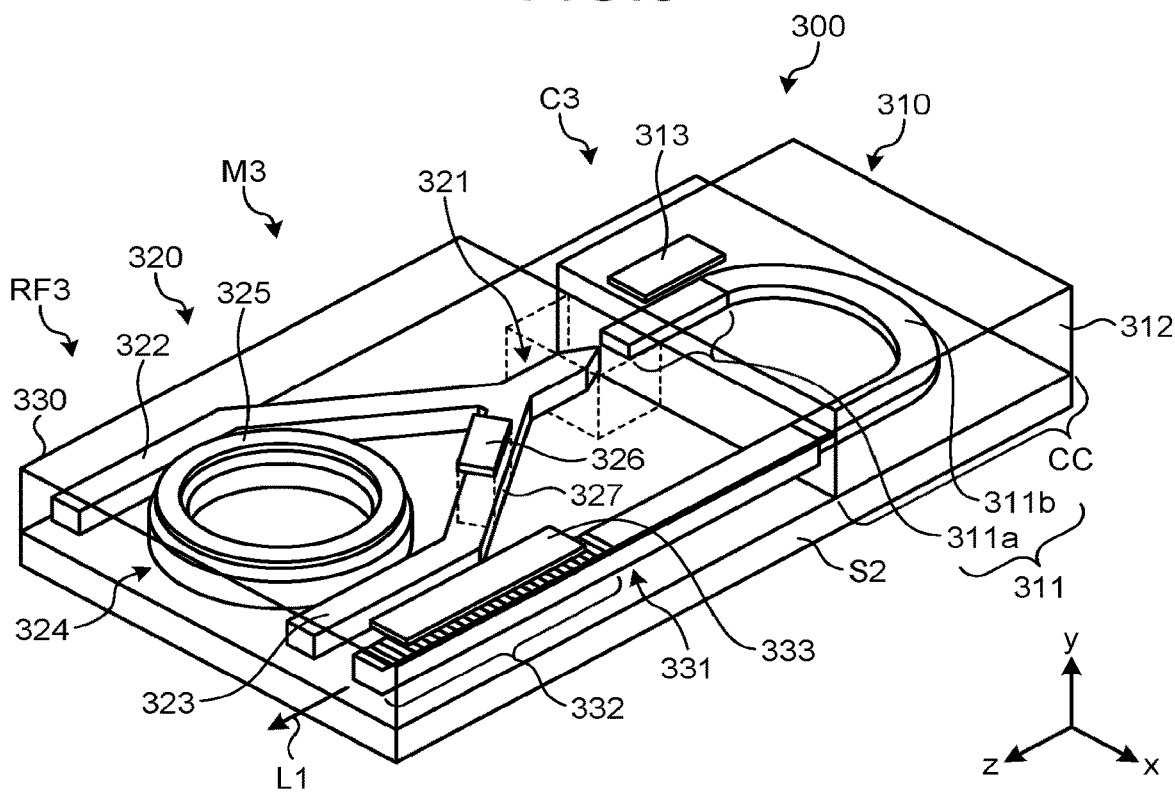
FIG. 8 is a schematic perspective view of a wavelength-tunable laser device according to a third embodiment.

FIG. 8 is a schematic perspective view of a wavelength-tunable laser device according to the third embodiment. A wavelength-tunable laser device 300 is configured such that laser oscillation occurs in the 1.55 μm band and laser light is output. The wavelength-tunable laser device 300 includes a first waveguide 310 and a second waveguide 320.

The first waveguide 310 includes a waveguide 311, a semiconductor stack 312, and an n-side electrode 313. The waveguide 311 is formed in the shape of the letter U so as to partially extend in the z direction in the inside of the semiconductor stack 312. In the first waveguide 310, a gain portion 311a and an optical waveguide layer 311b are disposed. The semiconductor stack 312 is formed such that semiconductor layers are layered and includes functions such as a cladding portion for the waveguide 311. The gain portion 311a extends in the z direction and has a multiple quantum well structure made of the same material as the gain portion 11a in the first embodiment. The optical waveguide layer 311b is an optical waveguide layer made of InGaAsP. In order to reduce optical loss in the optical waveguide layer 311b and efficiently confine light, the bandgap wavelength of the optical waveguide layer 311b is preferably shorter than the bandgap wavelength of the gain portion 311a, for example, equal to or shorter than 1.3 μm. The optical waveguide layer 311b forms the shape of the letter U together with the gain portion 311a. The semiconductor stack 312 in a portion including the gain portion 311a is formed with a material and structure similar to the portion including the gain portion 11a of the semiconductor stack 12 in the first embodiment, but the semiconductor stack 312 differs in that it has a stack structure in which the p-type semiconductor layer and the n-type semiconductor layer are reversed in position with the gain portion 311a interposed in the y direction. The semiconductor stack 312 in a portion including the optical waveguide layer 311b is formed with a material and structure similar to the portion including the diffraction grating layer 11b of the semiconductor stack 12 in the first embodiment, but the semiconductor stack 312 differs in that it has a stack structure in which the p-type semiconductor layer and the n-type semiconductor layer are reversed in position with the gain portion 311a interposed in the y direction. The first waveguide 310 has a buried waveguide structure.

The n-side electrode 313 is disposed along the gain portion 311a on the semiconductor stack 312. A SiN protective film is formed on the semiconductor stack 312 so as to cover the semiconductor stack 312, and the n-side electrode 313 is in contact with the semiconductor stack 312 through an opening formed in the SiN protective film. A not-illustrated p-side electrode is formed on a surface on the opposite side to the surface of the semiconductor stack 312 on which the n-side electrode 313 is formed.

The second waveguide 320 will now be described. The second waveguide 320 is formed with a SOI substrate. The second waveguide 320 includes a dual-branch portion 321, arms 322 and 323, a ring-shaped waveguide 324, microheaters 325 and 333, an overcladding layer 330 made of $SiO_2$, a waveguide 331, and a diffraction grating 332. The arm 323 has a microheater 326 and a phase adjuster 327.

The dual-branch portion 321 has a light input/output port through which light is input/output, and two branch ports through which light input from the light input/output port is split into two and output. In the present embodiment, the dual-branch portion 321 is configured with a 1×2 branched waveguide including a 1×2 MMI waveguide. Two branch ports are connected to two arms 322 and 323, and the light input/output port is connected to the first waveguide 310 side. The respective ends of two arms 322 and 323 are integrated by the dual-branch portion 321 and optically coupled to the diffraction grating 332. A tapered portion having its width reducing toward the first waveguide 310 is formed on the light input/output port side of the dual-branch portion 321. On the outer periphery of the tapered portion, an overcladding layer, for example, made of SiN with a refractive index higher than $SiO_2$ is formed to provide a spot size converter structure.

The arms 322 and 323 are formed so as to extend from the dual-branch portion 321 in the shape of the letter Y and parallel to each other. The arms 322 and 323 are disposed so as to sandwich the ring-shaped waveguide 324. The arms 322 and 323 are in proximity to the ring-shaped waveguide 324 and both are optically coupled to the ring-shaped waveguide 324 at the same coupling coefficient K. The arms 322 and 323 and the ring-shaped waveguide 324 constitute a ring resonator filter RF3. The ring resonator filter RF3 and the dual-branch portion 321 constitute a reflecting mirror M3. The microheater 325 serving as a second refractive index changing unit has a ring shape and is disposed on the overcladding layer 330 immediately above the ring-shaped waveguide 324.

The waveguide 331 is a waveguide extending in the z direction and has one end connected to the optical waveguide layer 311b side of the first waveguide 310 and the other end connected to the diffraction grating 332. The microheater 333 serving as a first refractive index changing unit is disposed along the diffraction grating 332 on the overcladding layer 330.

The components of the second waveguide 320, namely, the dual-branch portion 321, the arms 322 and 323, the ring-shaped waveguide 324, the phase adjuster 327, the waveguide 331, and the diffraction grating 332 have a high mesa waveguide structure similar to the corresponding elements in the second embodiment. In the diffraction grating 332, a sampled diffraction grating is formed along the z direction in the device layer functioning as an optical waveguide layer, and the grooves of the diffraction grating are filled with S102 of the overcladding layer 330.

The first waveguide 310 is separately fabricated as a gain chip by a known method and is mounted on a concave portion CC formed by removing the device layer, the BOX layer, and a part of the support substrate in the SOI substrate forming the second waveguide 320. The gain portion 311a of the first waveguide 310 is butt-joined to the light input/output port side of the dual-branch portion 321 of the second waveguide 320, and the optical waveguide layer 311b of the first waveguide 310 is butt-joined to the waveguide 331 of the second waveguide 320. Similar to the second embodiment, it is preferable that one port side of the dual-branch portion 321 of the second waveguide 320 is a tapered portion having its width reducing toward the first waveguide 310 and that an overcladding layer of SiN, for example, is formed on the outer periphery thereof to provide a spot size converter structure.

The diffraction grating 332 and the reflecting mirror M3 optically connected to each other constitute a laser resonator C3. The gain portion 311a is disposed in the laser resonator C3, and the phase adjuster 327 is disposed in the reflecting mirror M3.

In this wavelength-tunable laser device 300, the diffraction grating 332 generates a first comb-shaped reflection spectrum having a substantially periodic reflection characteristic at a substantially predetermined wavelength interval, similar to the first and second embodiments. The reflecting mirror M3 generates a second comb-shaped reflection spectrum having a peak with a full width at half maximum narrower than the full width at half maximum of a peak of the first comb-shaped reflection spectrum and having a substantially periodic reflection characteristic at a wavelength interval different from the wavelength interval of the first comb-shaped reflection spectrum. Laser oscillation occurs at a wavelength at which a peak of the first comb-shaped reflection spectrum, a peak of the second comb-shaped reflection spectrum, and one of the resonator modes of the laser resonator C3 are aligned. The spacing between resonator modes of the laser resonator C3 is narrower than the full width at half maximum of the spectral component in the first comb-shaped reflection spectrum. Optical feedback in the laser resonator C3 is performed on a path from the diffraction grating 332 through the dual-branch portion 321, one of the arms 322 and 323 of the ring resonator filter RF3, the ring-shaped waveguide 324, the other of the arms 322 and 323, and the dual-branch portion 321 in this order and back to the diffraction grating 332, and each optical feedback trip includes a circumnavigation of the ring-shaped waveguide 324. With this configuration, the wavelength-tunable laser device 300 according to the present third embodiment can reduce the linewidth of laser light and achieve stable single mode oscillation, similar to the first and second embodiments.

In the wavelength-tunable laser device 300, the laser emission wavelength can be tuned by performing coarse adjustment by tuning the first comb-shaped reflection spectrum and the second comb-shaped reflection spectrum with the microheater 333 for the diffraction grating 332 and the microheater 325 for the ring resonator filter RF3, respectively, and by performing fine adjustment by tuning the resonator length with the microheater 326 as a third refractive index changing unit for the phase adjuster 327, similar to the first and second embodiments.

The wavelength-tunable laser device 300 can be produced in the same manner as in the wavelength-tunable laser device 200 according to the second embodiment. Specifically, a part involving the second waveguide 320 is fabricated using a SOI substrate, and the first waveguide 310 separately fabricated is mounted on the concave portion CC by flip-chip bonding. The wavelength-tunable laser device 300 is thus completed.

The wavelength-tunable laser device 300 according to the present third embodiment can reduce the linewidth of laser light and achieve stable single mode oscillation, similar to the first and second embodiments, and has a small footprint and a compact size and can output laser light with a high side mode suppression ratio, similar to the second embodiment.

In the wavelength-tunable laser device 300, since the phase adjuster 327 is provided in the arm 323 in the reflecting mirror M3 serving as a reflection filter device. This configuration facilitates fine adjustment of the phase of light. The configuration is effective for precisely adjusting the laser emission wavelength or making it easy to control the microheater 326 for the adjustment.

As described above, since the wavelength-tunable laser device 300 includes the reflecting mirror M3 that facilitates fine adjustment of the phase, the laser emission wavelength can be adjusted more precisely, and control for the adjustment can be made easier.

Fourth Embodiment

Figure 9:
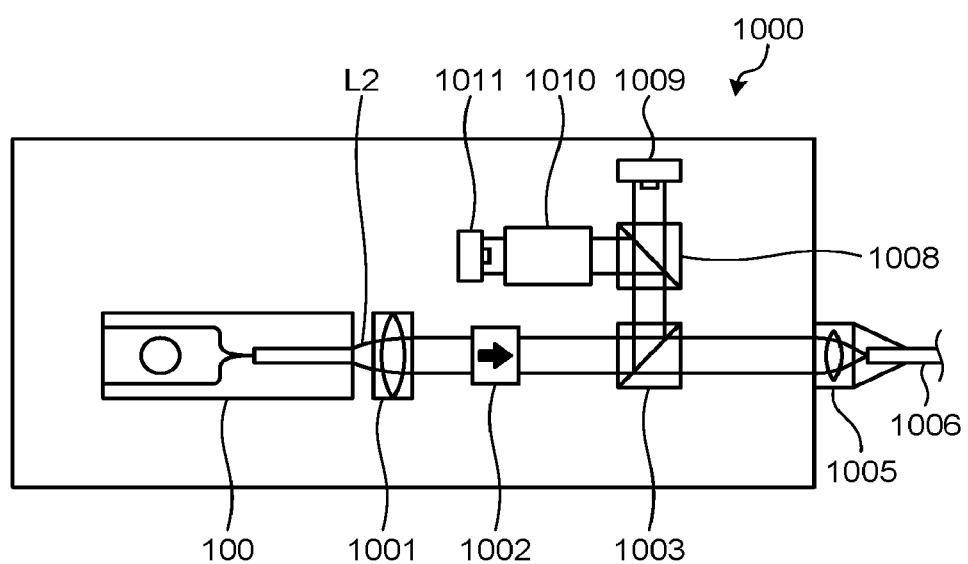
FIG. 9 is a diagram of a laser module according to a fourth embodiment.

A laser module according to a fourth embodiment will now be described. FIG. 9 is a diagram of a laser module according to the present fourth embodiment. A laser module 1000 includes the wavelength-tunable laser device 100 according to the first embodiment, a collimating lens 1001, an optical isolator 1002, a beam splitter 1003, a condenser lens 1005, an optical fiber 1006, a power monitor photodiode (PD) 1009 as a light-receiving element, an etalon filter 1010, and a power monitor PD 1011. The wavelength-tunable laser device 100 is placed in a not-illustrated thermoelectric cooler for adjusting the temperature of the wavelength-tunable laser device 100. The wavelength-tunable laser device 100, the power monitor PDs 1009 and 1011, and the thermoelectric cooler are connected to an external controller.

The wavelength-tunable laser device 100 is supplied with driving current from the controller, and laser light with a wavelength determined by factors such as the diffraction grating layer 1ib, the ring resonator filter RF1, and the phase adjuster 27 tuned by the microheaters 14, 25, and 26 under control of the controller is amplified by the optical amplifying portion 11c to a desired output power and output as laser light L2. The collimating lens 1001 shapes the laser light L2 output from the wavelength-tunable laser device 100 into collimated light. The optical isolator 1002 allows the laser light L2 shaped into the collimated light by the collimating lens 1001 to pass through only in one direction. The beam splitter 1003 transmits a large part of the laser light L2 transmitted through the optical isolator 1002 and splits a part of the laser light L2 to the power monitor PD 1009 side. The power monitor PD 1009 receives a part of the laser light L2 split by beam splitter 1008 and outputs current having a value corresponding to the received light intensity. The etalon filter 1010 has a transmission wavelength characteristic having peaks periodically changing with the order of multiple interference and transmits the laser light L2 transmitted through the beam splitter 1008 at a transmittance determined by the transmission wavelength characteristic at the wavelength of the laser light L2. The period of the etalon filter 1010 is, for example, 50 GHz in terms of optical frequency. The power monitor PD 1011 receives the laser light L2 transmitted through the etalon filter 1010 and outputs current having a value corresponding to the received light intensity. The condenser lens 1005 focuses the laser light L2 transmitted through the beam splitter 1003 and couples the laser light L2 to the optical fiber 1006. The optical fiber 1006 propagates the coupled laser light L2 to the outside. The laser light L2 is used, for example, as signal light for optical fiber communication. Although a bulk etalon filter 1010 is used, a waveguide filter may be used instead.

The laser module 1000 includes the wavelength-tunable laser device 100 and therefore achieves a narrower linewidth of laser light L2 and stable single mode oscillation and outputs laser light L2 with a higher power. In addition, the laser emission wavelength can be precisely adjusted and easily controlled. The currents output from the power monitor PDs 1009 and 1011 are monitored to monitor the received light intensity so that the controller can perform wavelength lock control.

Specifically, in the wavelength lock control, the controller performs control to change the driving current and the temperature of wavelength-tunable laser device 100A such that the ratio between the power of laser light monitored by the power monitor PD 1009 and the power of laser light transmitted through the etalon filter 1010 monitored by the power monitor PD1011 attains the ratio at which the wavelength of the laser light L2 is a desired wavelength. The wavelength of the laser light L2 thus can be adjusted to a desired wavelength (lock wavelength).

In the foregoing first and second embodiments, in the first waveguide, the diffraction grating layer is provided adjacent to the gain portion in the light propagating direction in the waveguide. However, the present invention is not limited thereto, and the diffraction grating layer may be provided along the gain portion in the vicinity of the gain portion in the stacking direction (y direction) of the semiconductor layer in the first waveguide to form a distributed feedback (DFB) laser structure.

In the foregoing first to third embodiments, a phase adjuster is provided in one of the two arms. However, the present invention is not limited thereto. Phase adjusters may be provided in both of the two arms, and the length per phase adjuster may be shorter than that of the first to third embodiments. Also in this case, light passes through one phase adjuster only in one direction in each optical feedback and thus the effect of the present invention is achieved. In addition, the length of the phase adjusters and the arms for applying a required amount of phase adjustment can be reduced.

The gain chip, that is, the first waveguide in the foregoing second and third embodiments is not limited to the one described above. For example, the first waveguide may have a quantum well structure or a quantum dot structure on an InP or GaAs substrate. Examples of a compound semiconductor material that can be used for the quantum well structure include III-V group compound semiconductors such as InGaAs, InGaAsN, AlInGaAs, and InGaAs. Examples of a compound semiconductor material that can be used for the quantum dot structure include III-V group compound semiconductors such as InAs and InGaA.

In the foregoing embodiments, the diffraction grating is a sampled diffraction grating. However, the kind of diffraction grating is not limited thereto and may be a superstructure grating or a superimposed grating.

In the foregoing embodiments, the arms are in proximity to the ring-shaped waveguide and thereby optically coupled to the ring-shaped waveguide. However, the arms and the ring-shaped waveguide may be optically coupled through an MMI waveguide having a high mesa waveguide structure or a directionally coupling waveguide.

It should be noted that the present invention is not limited by the foregoing embodiments. The present invention includes configurations obtained by combining the components described above as appropriate. Additional effects and modifications can be easily derived by those skilled in the art. A wider range of modes of the present invention is not limited to the foregoing embodiments and various modifications are possible.

As described above, the reflection filter device and the wavelength-tunable laser device according to the present invention can be preferably used mainly for an optical communication.

According to the present invention, it is possible to provide a reflection filter device that facilitates fine adjustment of the phase.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A reflection filter device comprising:
a ring resonator filter including a ring-shaped waveguide and two arms, each of the two arms being optically coupled to the ring-shaped waveguide; and
a dual-branch portion including a light input/output port and two branch ports, the light input/output port being configured to allow input and output of light, the two branch ports being configured to allow output of the light input from the light input/output port, the light being split into two, the two arms being connected to the two branch ports, respectively, wherein both of the two arms are equipped with respective phase adjusters.

2. The reflection filter device according to claim 1, wherein the two arms have a high mesa waveguide structure.

3. A wavelength-tunable laser device comprising:
a laser resonator including a diffraction grating, a ring-shaped waveguide, two arms, a dual-branch portion, and a reflection filter device, each of the two arms being optically coupled to the ring-shaped waveguide, the dual-branch portion including a light input/output port and two branch ports, the light input/output port being configured to allow input and output of light, the two branch ports being configured to allow output of the light input from the light input/output port, the light being split into two, the two arms being connected to the dual-branch ports, respectively, at least one of the two arms being equipped with a phase adjuster and a refractive index changing unit arranged along the phase adjuster, the reflection filter device being optically coupled to the diffraction grating on the light input/output port;
a gain portion disposed in the laser resonator, wherein:
the phase adjuster and the refractive index changing unit are arranged in the arms and separated from the gain portion,
the diffraction grating generates a first comb-shaped reflection spectrum,
the reflection filter device generates a second comb-shaped reflection spectrum having a peak with a full width at half maximum narrower than a full width at half maximum of a peak of the first comb-shaped reflection spectrum and having a wavelength interval different from a wavelength interval of the first comb-shaped reflection spectrum, and the diffraction grating and the reflection filter device are configured such that one of peaks of the first comb-shaped reflection spectrum and one of peaks of the second comb-shaped reflection spectrum are overlappable on a wavelength axis;

a first refractive index changing unit configured to change a refractive index of the diffraction grating; and a second refractive index changing unit configured to change a refractive index of the ring-shaped waveguide, wherein one of peaks of the first comb-shaped reflection spectrum and one of peaks of the second comb-shaped reflection spectrum are overlapped on a wavelength axis by using at least one of the first refractive index changing unit and the second refractive index changing unit.

4. The wavelength-tunable laser device according to claim 3, wherein the light input/output port side is optically coupled to a waveguide structure having the diffraction grating in a state in which optical propagation modes are substantially made equivalent.

5. The wavelength-tunable laser device according to claim 3, wherein a semiconductor optical amplifier is integrated.

6. The wavelength-tunable laser device according to claim 3, wherein the diffraction grating is disposed in a vicinity of the gain portion.

7. The wavelength-tunable laser device according to claim 3, wherein the diffraction grating is disposed along the gain portion.

8. The wavelength-tunable laser device according to claim 3, wherein the laser resonator is configured such that a spacing between resonator modes is such that two or more of the resonator modes are included in a peak of the first comb-shaped reflection spectrum.

9. The wavelength-tunable laser device according to claim 3, wherein peaks of the first comb-shaped reflection spectrum have a Gaussian shape, and peaks of the second comb-shaped reflection spectrum have a double exponential distribution shape.

10. The wavelength-tunable laser device according to claim 3, further comprising:

a third refractive index changing unit serving as the refractive index changing unit arranged along the phase adjuster and configured to adjust a refractive index of the phase adjuster, wherein the first refractive index changing unit, the second refractive index changing unit, and the third refractive index changing unit are resistive heaters disposed in a vicinity of the diffraction grating, the ring-shaped waveguide, and the phase adjuster, respectively, to thermally change respective refractive indices.

* * * * *